United States Patent [19]

Kitoh et al.

[11] Patent Number: 5,621,747
[45] Date of Patent: Apr. 15, 1997

[54] MULTI QUANTUM WELL SEMICONDUCTOR LASER AND OPTICAL COMMUNICATION SYSTEM USING THE SAME

[75] Inventors: Masahiro Kitoh, Toyonaka; Nobuyuki Otsuka, Kawanishi; Masato Ishino, Shijonawate; Yasushi Matsui, Neyagawa, all of Japan

[73] Assignee: Matsushita Electric Industrial Co., Ltd., Osaka, Japan

[21] Appl. No.: 366,027

[22] Filed: Dec. 29, 1994

Related U.S. Application Data

[63] Continuation of Ser. No. 209,538, Mar. 11, 1994, abandoned.

[30] Foreign Application Priority Data

Mar. 12, 1993 [JP] Japan .................................. 5-051892

[51] Int. Cl.⁶ .................................................. H01S 3/18
[52] U.S. Cl. .................................................. 372/45; 372/46
[58] Field of Search .................................. 372/43, 45, 46, 372/50

[56] References Cited

U.S. PATENT DOCUMENTS 5,048,036  9/1991  Scifres et al. .

FOREIGN PATENT DOCUMENTS

| 0557727 | 9/1993 | European Pat. Off. . | |
|---|---|---|---|
| 61-242088 | 10/1986 | Japan . | |
| 0242088 | 10/1986 | Japan . | |
| 4206789 | 7/1992 | Japan .................................. | 372/45 |
| 0170582 | 10/1992 | Japan . | |
| 5114764 | 7/1993 | Japan . | |
| 5267777 | 10/1993 | Japan . | |

OTHER PUBLICATIONS

Kito, M. et al. "Extremely Low Bias Current Operation of 1.3 μm Strained–Layer MQW–DFB Laser for 97ch AM–FDM Transmission", *Extended Abstracts of the 1993 International Conference on Solid State Devices and Materials*, pp. 1035–1037 (Aug. 29, 1993).

EPO Communication (94103790.5-2214) dated Aug. 14 1995.

M. Kito et al., "Low Distortion up to 2 GHz in 1.55 μm Multiquantum Well Distributed–Feedback Laser", *Electronics Letters*, Apr. 23, 1992, vol. 28, No. 9, pp. 891–892.

T.E. Darcie et al., "Fiber–Reflection–Induced Impairments in Light–wave AM–VSB CATV Systems", *Journal of Wavelength Technology*, vol. 9, No. 8, Aug. 1991, pp. 991–995.

E. Yablonovitch et al., "Reduction of Lasing Threshold Current Density by the Lowering of Valence Band Effective Mass", *Journal of Lightwave Technology*, vol. LT-4, No. 5, May 1986, pp. 504–506.

Tatham et al., "Frequency Response and Differential Gain in Strained and Unstrained InGaAs/InGaAsP Quantum Well Lasers", *Electronics Letters*, vol. 27, No. 14, Jul. 4, 1991, pp. 1278–1280.

(List continued on next page.)

Primary Examiner—Rodney B. Bovernick
Assistant Examiner—Yisun Song
Attorney, Agent, or Firm—Ratner & Prestia

[57] ABSTRACT

A multi quantum well semiconductor laser includes an InP substrate and a multi-layered structure formed on the InP substrate, lasing at 1.29 μm to 1.33 μm wavelength, wherein the multi-layered structure includes at least a multi quantum well active layer, the multi quantum well active layer including InGaAsP well layers and InGaAsP barrier layers alternately provided, the InGaAsP barrier layers are lattice matched with the InP substrate, and a bandgap wavelength of the InGaAsP barrier layers is substantially equal to 1.05 μm.

5 Claims, 10 Drawing Sheets

OTHER PUBLICATIONS

Thijs et al., "High–Performance 1.5 μm Wavelength InGaAs–InGaAsP Strained Quantum Well Lasers and Amplifiers", *IEEE Journal of Quantum Electronics*, vol. 27, No. 6, Jun. 1991, pp. 1426–1439.

Yablonovitch et al., "Band Structure Engineering of Semiconductor Lasers for Optical Communications", *Journal of Lightwave Technology*, vol. 6, No. 8, Aug. 1988, pp. 1292–1299.

M. Kito et al., "Extremely Low Bias Current Operation of 1.3 μm Strained–Layer MQW–DFB Laser for 97ch AM–FDM Tranmission", *Extended Abstracts of the 1993 International Conference on Solid State Devices and Materials*, Aug.1993 & Sep. 1993, pp. 1035–1037.

M. Kitamura et al., "High Performance λ/4 Shifted MQW–DFB–DC–PBH–LDs and InGaAs Dual PIN–PDs for Gbps Coherent Optical Communication Systems", *NEC Research & Development*, vol. 33, No. 3, pp. 340–351 (Jul. 1992).

N.K. Dutta et al., "Long Wavelength InGaAsP (λ~1.3 μm) Modified Multiquantum Well Laser", *Applied Physics Letters*, vol. 46, No. 11, pp. 1036–1038 (Jun. 1985).

N.K. Dutta et al., "InGaAsP Distributed Feedback Multiquantum Well Laser", *Applied Physics Letters*, vol. 48, No. 21, pp. 1419–1421 (May 1986).

S. Hausser et al, "1.3 μm Decoupled Confinement Heterostructure Lasers Grown by Chemical Beam Epitaxy", *Applied Physics Letters*, vol. 62, No. 7, pp. 663–663 (Feb. 1993).

K. Uomi et al., "Dependence of High–Speed Properties on the Number of Quantum Wells in 1.55 μm InGaAs–InGaAsP MQW λ/4–shift DFB Lasers," *IEEE Journal of Quantum Electronics*, vol. 29, No. 2, pp. 355–360 (Feb. 1993).

P. Grodzinski et al, "Low Threshold 1.5 μm Quarternary Quantum Well Lasers Grown by MOCVD", *4th International Conference on Indium Phosphide and Related Materials, Newport*, pp. 449–452 (Apr. 1992).

"MQW Distributed–feedback Lasers with Low Chirping", *Optical Fiber Communication Conference, San Jose, Technical Digest Series*, vol. 5 p. 271 (Feb. 1992).

European Search Report (94103790.5) dated Nov. 7, 1994.

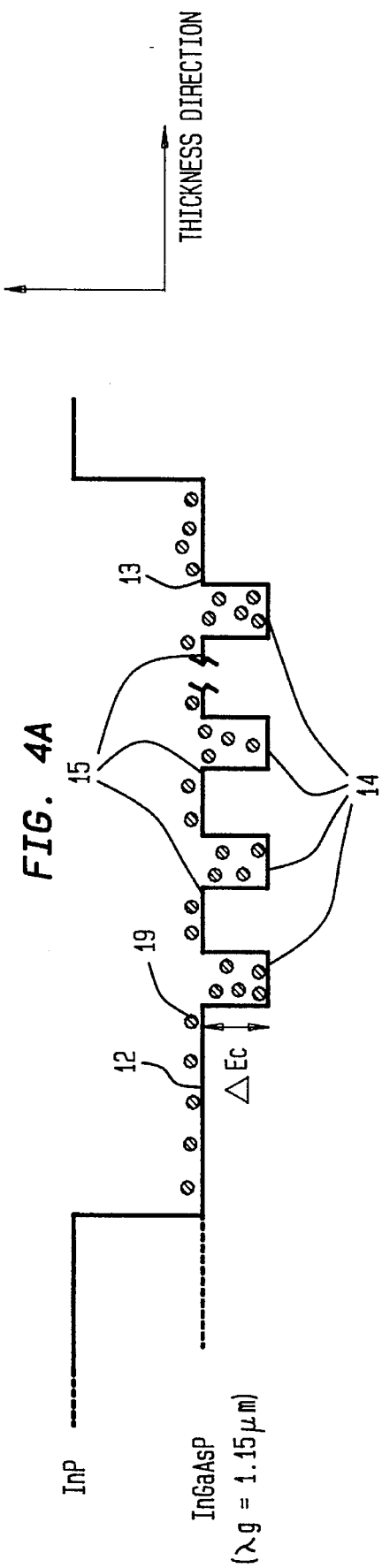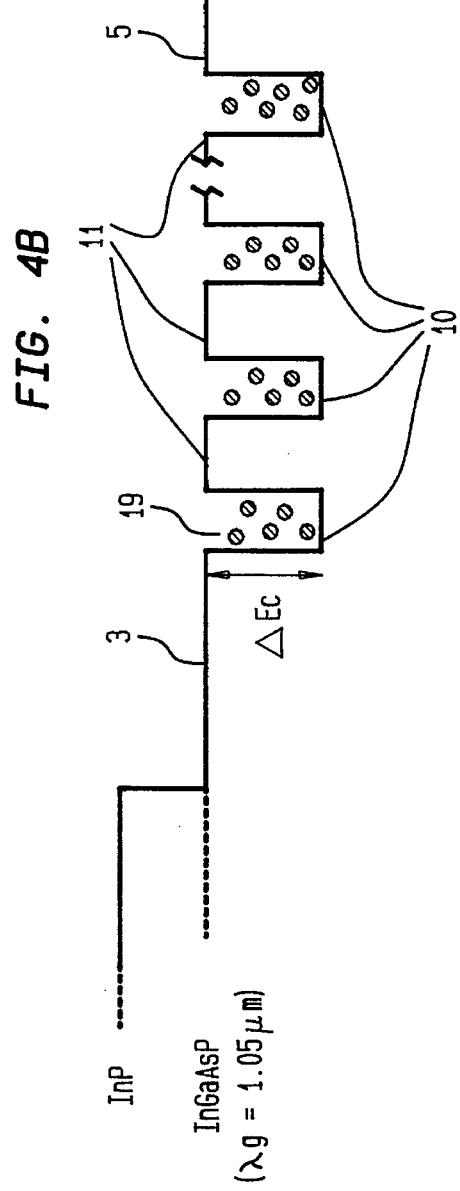

5,621,747

MULTI QUANTUM WELL SEMICONDUCTOR LASER AND OPTICAL COMMUNICATION SYSTEM USING THE SAME

This application is a continuation of application Ser. No. 08/209,538 filed Mar. 11, 1994, now abandoned.

BACKGROUND OF THE INVENTION

1. Field of the Invention

The present invention relates to a multi quantum well semiconductor laser. In particular, the present invention relates to a multi quantum well semiconductor laser suitable for a light source for optical communications used in a CATV and the like, in which signals are transmitted by a plurality of carrier waves, and to an optical communication system using the multi quantum well semiconductor laser as a light source for information transmission.

2. Description of the Related Art

In recent years, an analog multiple light transmission system has been introduced into the field of image transmission, particularly, a CATV. In such an analog multiple light transmission system, the transmission of light (40 channels, about 10 km) using AM modulation has reached a practical level. As a light source used in the system, a long wavelength bandwidth semiconductor laser having a low noise, low transmission distortion characteristic is required. An example of such a light source includes a distributed-feedback semiconductor laser (hereinafter, referred to as a DFB laser) using an InGaAsP/InP material.

In the case where the number of channels increases to 40 or more, the modulation frequency bandwidth is required to be 300 MHz or more. It is known that the increase in modulation frequency bandwidth rapidly increases frequency distortion because modulation frequencies close to a relaxation oscillation frequency; as a result, a low transmission distortion characteristic cannot be obtained (Electronics Letters Vol. 28 No. 9 (1992) 891).

Under the above-mentioned circumstances, in order to widen a modulation frequency bandwidth and achieve a higher relaxation oscillation frequency, a DFB laser having a multi quantum well structure as an active layer has been fabricated.

FIG. 6 shows a structure of a representative 1.3 μm wavelength DFB semiconductor laser used for 40 channel-10 km transmission. The DFB laser includes an n-type InP substrate 1 and a stripe-shaped cavity formed on the substrate 1. The stripe-shaped cavity includes a diffraction grating 2 with a period of 200 nm formed on the n-type InP substrate 1, an n-type InGaAsP optical wave guide layer 12 (thickness: 0.15 μm, bandgap wavelength (composition wavelength) λ g=1.15 μm), a 10-layered quantum well active layer 4, a p-type InGaAsP optical wave guide layer 13 (thickness: 30 nm, λ g=1.15 μm), and a p-type InP cladding layer 6. The quantum well active layer 4 includes InGaAsP well layers 14 (each layer thickness: 4 nm, bandgap wavelength λ g=1.4 μm) and InGaAsP barrier layers 15 (each layer thickness: 10 nm, bandgap wavelength λ g=1.15 μm).

The reason for using InGaAsP having a bandgap wavelength of λ g=1.15 μm as material for the optical wave guide layer 12 and the barrier layers 15 is as follows. Light is sufficiently confined in the quantum well active layer 4 because of its material's relatively high refractive index. As a result, a low threshold current characteristic can be obtained. The stripe-shaped cavity is buried from both sides with current blocking layers made of p-type InP 16, n-type InP 17, and p-type InP 6. The length of the stripe-shaped cavity (cavity length) is 300 μm, and its width is 1.2 μm. Each end facet of the cavity is covered with an appropriate dielectric film, whereby the reflectance on the light-emitting face and that on the face opposite to the light-emitting face are set to be 5% and 70%, respectively.

FIG. 9 is a graph showing the relation between a composite second order distortion (CSO) and a bias current dependence of an optical fiber output (Pf) from a module. Herein, the CSO and the bias current dependence are obtained when the above-mentioned semiconductor laser is provided in the module having an isolator, and 58 channels of TV signals are transmitted for 10 km through optical fibers in an NTSC system. The CSO was detected at 55 MHz where the number of composite distortions becomes maximum.

In this graph, a curve (a) represents a characteristic of a satisfactory semiconductor laser. In this semiconductor laser, the optical fiber output can be obtained in such a wide range as 2 to 6 mW, and a low transmission distribution characteristic (i.e., CSO<–60 dBc) can be obtained. In addition, 53 dB or more of noise (CNR) characteristic and –65 dBc or less of a composite third order distortion (CTB) can be obtained. Accordingly, this semiconductor laser satisfies the qualities required for a high image quality CATV.

However, the above-mentioned conventional semiconductor laser has the following problems.

Among semiconductor lasers lasing in a single mode, the number of semiconductor lasers having a characteristic as represented by the curve (a) of FIG. 9 is 10% or less. Most of the semiconductor lasers actually have characteristics as represented by curves (b) and (c) of FIG. 9. This means that each semiconductor laser is different in CSO.

This is due to an axis-direction hole burning effect. The axis-direction hole burning effect is caused by the fluctuation of a refractive index of a laser cavity during modulation. The degree of the axis-direction hole burning effect mainly depends upon the height and phase of the diffraction grating at the end facets thereof, the reflectance on the end facets of the laser cavity, and the like. The height and phase of the diffraction grating, and the reflectance on the end facets of the laser cavity are varied depending upon the kind of semiconductor laser; thus, the characteristics of the semiconductor lasers are also varied.

In an actual fiber transmission path, a plurality of light connectors are present, causing the reflection on the end facets of the light connectors. Between such a plurality of reflective points, multiple reflection is caused. It is pointed out that when the wavelength fluctuation is large during modulation of the DFB laser which is a light source, additional noise and transmission distortion are caused because of the effects of multiple reflection (J. Lightwave Technol. 9 (1991) 991). Hereinafter, such a wavelength fluctuation is referred to as "chirping".

The amount of chirping of the conventional DFB laser is large, i.e., 200 MHz/mA or more at a modulation frequency of 1GHz or less. Because of this, additional noise and transmission distortion are caused.

The amount of chirping ($\Delta F/\Delta I$) of a semiconductor laser is represented by the following expression:

$$\Delta F/\Delta I = F0 \cdot \Gamma/(L \cdot Nw \cdot Lz \cdot W) \tag{1}$$

where $\Gamma$ is an optical confinement factor in a well layer, L is a cavity length, Nw is the number of well layers, Lz is a well width, W is a stripe width of an active layer, and F0 is a term of a proportional coefficient. Assuming that L, W, and Lz are constant, in order to decrease the amount of chirping (Δ F/Δ I), the term Γ/Nw should be made small.

By decreasing Nw from 10 (conventional example) to 5, Γ/Nw is decreased to 80%. Thus, the amount of chirping (Δ F/Δ I) is expected to be decreased by a similar degree.

FIG. 7 shows a chirping characteristic (modulation frequency fm=200 MHz) of DFB lasers having the same structure as that of the conventional example, with varying of the number of wells (5, 7, and 10). Herein, the bias current is set to be Ith (threshold current)+30 mA. As is understood from FIG. 7, the amount of chirping increases with the decrease in the number of well layers; thus, the characteristic expected from Expression 1 cannot be obtained.

In the field of future image transmission, the introduction of FM modulation has been considered in order to realize the greatest number of channels (e.g., 100 channels or more), non-relay transmission of 20 km or more, a multi-distribution system, and a high image quality transmission. In a DFB laser realizing such an advanced image transmission, a low distortion characteristic at a higher optical output and a wider modulation frequency bandwidth, compared with the conventional example, are required. As described above, in order to realize a low distortion characteristic at a high frequency bandwidth, the relaxation oscillation frequency of the DFB laser needs to be increased. In recent years, technology for increasing the relaxation oscillation frequency has been extensively studied. An example of this technology is the introduction of strain into well layers in a multi quantum well structure (MQW) (J. Lightwave Technol. LT-4 (1986) 504 and others).

A strained MQW-DFB laser, in which 0.7% compressive strain is induced into only well layers of the semiconductor laser having the conventional structure, is fabricated. A relaxation oscillation frequency characteristic is compared between the strained MQW-DFB laser and the unstrained MQW-DFB laser. FIG. 8 shows the results. The horizontal axis of the graph of FIG. 8 represents the number of well layers, and the vertical axis represents the relaxation oscillation frequency normalized with an injection current amount above a threshold value (normalized relaxation oscillation frequency).

FIG. 8 shows that as the normalized relaxation oscillation frequency is higher, a higher relaxation oscillation frequency can be obtained at a lower injection current amount. As is understood from the comparison between the strained semiconductor laser and the unstrained semiconductor laser, no difference in normalized relaxation frequency is found regardless of the number of well layers. That is, the effects of the introduction of strain are not obtained.

As described above, in the conventional semiconductor laser, in order to realize a low threshold current characteristic, InGaAsP having a bandgap wavelength of λ g of 1.1 μm or more is used as a material for the optical wave guide layer and the barrier layers. However, when InGaAsP having such a large bandgap wavelength is used for the barrier layers, the difference in bandgap energy (Δ Eg) between the well layer and the barrier layer in a 1.3 μm wavelength MQW structure becomes very small.

In the case where InGaAsP having a bandgap wavelength λ g of 1.15 μm is used for the barrier layers, Δ Eg becomes 124 meV; in particular, the difference in bandgap energy (Δ Ec) of a conduction band becomes a small value (i.e., 50 meV). In this case, as shown in FIG. 4A, electrons 19 injected into the well layers 14 overflow the well layers 14 to barrier layers 15 because of a small Δ Ec. Consequently, the electrons 19 overflowing the well layers 14 are present in the optical wave guide layers 12 and 13. The electrons 19 present in the optical wave guide layers 12 and 13 cause the fluctuation of a refractive index due to the modulation, resulting in an increase in the amount of chirping. Such a fluctuation of the refractive index causes the above-mentioned axis-direction hole burning effect, leading to the deterioration of distortion characteristics. In addition, the overflown electrons 19 deteriorate the effects of the strain introduction into the well layers 14. Thus, even though strain is introduced into the well layers 14, the relaxation oscillation frequency is not increased.

As described above, the conventional MQW-DFB laser in which the optical wave guide layer and the barrier layers are made of InGaAsP having a bandgap wavelength λ g of 1.15 μm has the following problems:

(1) A low distortion characteristic is not likely to be obtained.

(2) A low chirping characteristic is not likely to be obtained.

(3) The introduction of strain into the well layers does not increase the relaxation oscillation frequency.

These problems have prevented a DFB laser having a wide bandwidth, low distortion characteristic and no transmission deterioration from being fabricated with high yield.

SUMMARY OF THE INVENTION

The multi quantum well semiconductor laser of this invention comprises an InP substrate and a multi-layered structure formed on the InP substrate, lasing at 1.29 μm to 1.33 μm wavelength, wherein the multi-layered structure includes at least a multi quantum well active layer, the multi quantum well active layer including InGaAsP well layers and InGaAsP barrier layers alternately provided, the InGaAsP barrier layers are lattice matched with the InP substrate, and a bandgap wavelength of the InGaAsP barrier layers is substantially equal to 1.05 μm.

In one embodiment of the present invention, the multi-layered structure further includes at least one InGaAsP optical wave guide layer provided so as to be adjacent to the multi quantum well active layer, the InGaAsP optical wave guide layer is lattice matched with the InP substrate, and a bandgap wavelength of the InGaAsP optical wave guide layer is substantially equal to 1.05 μm.

In another embodiment of the present invention, the multi-layered structure is formed in a stripe shape extending along a cavity length.

In another embodiment of the present invention, the InP substrate has a diffraction grating for distributed feedback on at least part of its surface.

According to another aspect of the present invention, an optical communication system using the above-mentioned semiconductor laser as a light source for light transmission is provided.

According to still another aspect of the present invention, a multi quantum well semiconductor laser comprises an InP substrate and a multi-layered structure formed on the InP substrate, lasing at 1.54 μm to 1.57 μm wavelength, wherein the multi-layered structure includes at least a multi quantum well active layer, the multi quantum well active layer including InGaAsP well layers and InGaAsP barrier layers alternately provided, the InGaAsP barrier layers are lattice matched with the InP substrate, and a bandgap wavelength of the InGaAsP barrier layers is substantially equal to 1.15 μm.

In one embodiment of the present invention, the multi-layered structure further includes at least one InGaAsP optical wave guide layer provided so as to be adjacent to the multi quantum well active layer, the InGaAsP optical wave guide layer is lattice matched with the InP substrate, and a bandgap wavelength of the InGaAsP optical wave guide layer is substantially equal to 1.15 μm.

In another embodiment of the present invention, the multi-layered structure is formed in a stripe shape extending along a cavity length.

In another embodiment of the present invention, the above-mentioned multi quantum well semiconductor laser further comprises a semiconductor layer having a refractive index lower than a refractive index of the multi quantum well active layer, and the semiconductor layer covers at least both sections of the multi-layered structure in a stripe shape.

In another embodiment of the present invention, the InP substrate has a diffraction grating for distributed feedback on at least part of its surface.

In another embodiment of the present invention, the InP substrate has a ridge portion in a stripe shape on which the diffraction grating for distributed feedback is formed, and the multi-layered structure in a stripe shape is formed on the ridge portion in a stripe shape of the substrate.

In another embodiment of the present invention, the multi-layered structure in a stripe shape further includes a semiconductor layer on which a diffraction grating for distributed feedback is formed.

In another embodiment of the present invention, the InGaAsP well layers have compressive strain.

In another embodiment of the present invention, the compressive strain of the InGaAsP well layers is in the range of 0.5% to 1.5%.

According to still another aspect of the present invention, an optical communication system using the above-mentioned semiconductor laser as a light source for light transmission is provided.

As described above, the problems in the conventional semiconductor laser are caused by the overflow of electrons from the well layers. In the MQW-DFB laser according to the present invention, in order to prevent the electrons from overflowing the well layers, for example, InGaAsP having a bandgap wavelength $\lambda g$ of about 1.05 μm is used as a material for the optical wave guide layer and the barrier layers. In the case where InGaAsP having a bandgap wavelength $\lambda g$ of 1.05 μm is used for the barrier layers, $\Delta Eg$ becomes 230 meV and the difference in bandgap energy ($\Delta Ec$) of the conduction band becomes large (i.e., 90 meV) in a 1.3 μm wavelength MQW structure. These values are twice or more of those in the case where InGaAsP having a bandgap wavelength $\lambda g$ of 1.15 μm is used for the barrier layers.

In the above-mentioned case, as shown in FIG. 4B, $\Delta Ec$ is large, so that the electrons 19 injected into well layers 10 do not overflow to the barrier layers 11. Thus, it is understood that a low amount of chirping can be realized. In addition, since the fluctuation of a refractive index during modulation is decreased, the axis-direction hole burning effect can be suppressed, making it easy to obtain a low distortion characteristic.

In the case where InGaAsP having a bandgap wavelength $\lambda g$ of 1.05 μm is used for the barrier layers, the refractive index of the barrier layers is relatively low. Therefore, the optical confinement factor in the active layer is decreased and the threshold current is increased; however, the threshold current can be decreased by the introduction of strain into the well layers. Thus, a threshold current, which is as low as that of the conventional MQW laser using InGaAsP having a bandgap wavelength $\lambda g$ of 1.15 μm for the optical wave guide layer and the barrier layers, can be obtained. In addition, since the electrons do not overflow the well layers to the barrier layers, a high relaxation oscillation frequency can be obtained by the introduction of strain into the well layers.

In the case where InGaAsP having a bandgap wavelength $\lambda g$ of 1.05 μm is used for the optical wave guide layer, the difference in refractive index between the InP substrate, on which the diffraction grating is formed, and the optical wave guide layer decreases, compared with the difference in refractive index in the conventional example. This means that a standardization coupling coefficient at a level similar to that of the conventional example is obtained to increase the height of the diffraction grating. The standardization coupling coefficient indicates the degree of light feedback by the diffraction grating in the laser cavity. In order to obtain a low distortion characteristic with high yield, this standardization coupling coefficient needs to be controlled in a narrow range of 0.8 to 1.0. However, the height of the diffraction grating is very low (i.e., tens of nm); thus, the control of the height of the diffraction is difficult. According to the present invention, the height of the diffraction grating can be made higher than that of the conventional example, so that the dependence of the standardization coupling coefficient upon the height of the diffraction grating becomes smaller than the conventional example. As a result, the standardization coupling coefficient can be easily controlled, and a low distortion characteristic can be obtained with high yield.

Thus, the invention described herein makes possible the advantages of providing a multi quantum well semiconductor laser having a broad bandwidth low distortion characteristic and no transmission deterioration with high yield.

These and other advantages of the present invention will become apparent to those skilled in the art upon reading and understanding the following detailed description with reference to the accompanying figures.

BRIEF DESCRIPTION OF THE DRAWINGS

FIG. 4A shows a state of electrons in a quantum well structure of a conventional multi quantum well semiconductor laser; and FIG. 4B shows a state of electrons in a quantum well structure of the multi quantum well semiconductor laser according to the present invention.

DESCRIPTION OF THE PREFERRED EMBODIMENTS

Hereinafter, the present invention will be described by way of illustrative examples with reference to the drawings.

EXAMPLE 1

Figure 1:
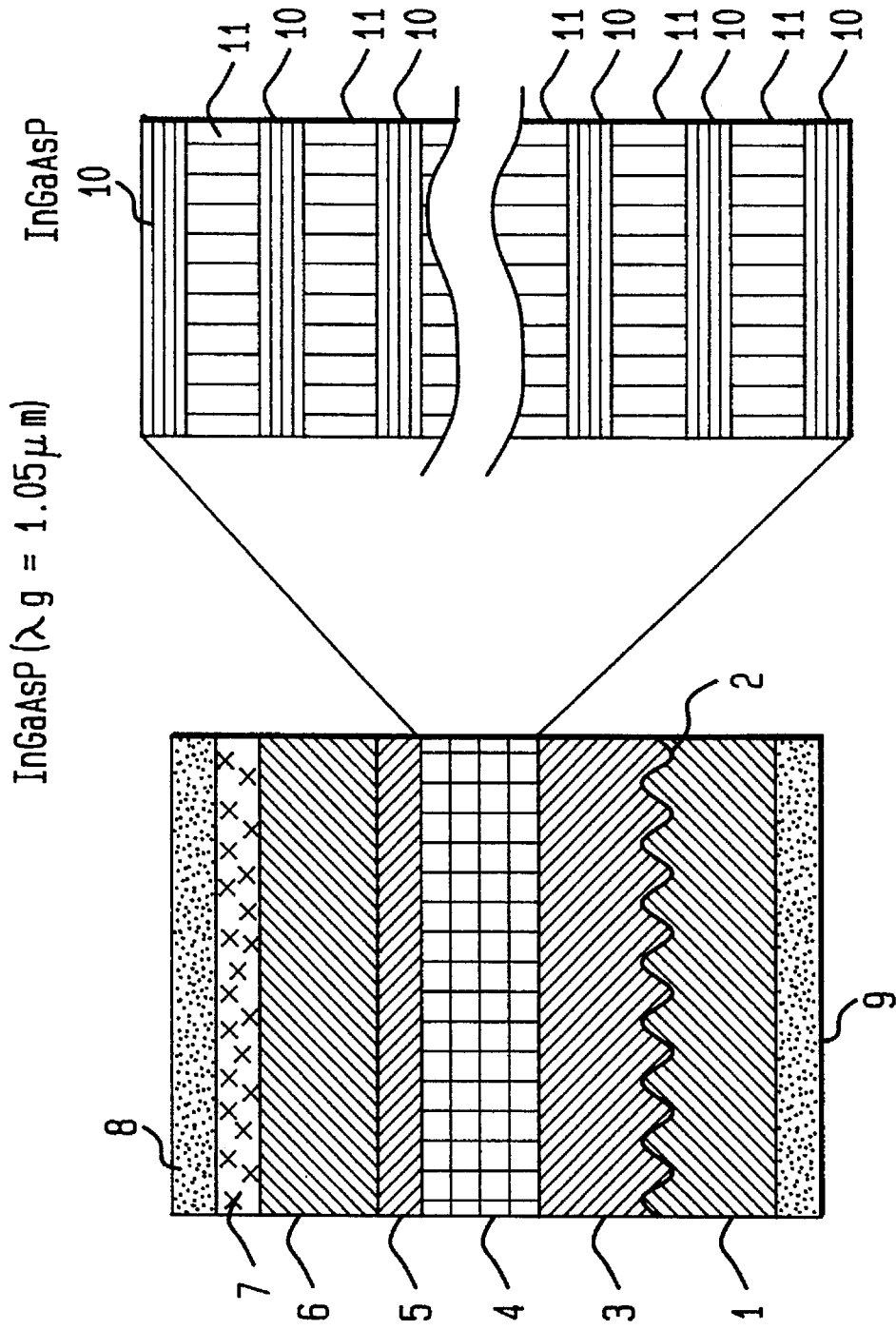
FIG. 1 is a diagram illustrating the structure of a multi quantum well semiconductor laser according to the present invention.

FIG. 1 shows a cross-sectional view of a main portion of an MQW-DFB semiconductor laser according to the present invention.

As shown in FIG. 1, the MQW-DFB laser of Example 1 includes an n-type InP substrate 1 ($n=1\times10^{18}$ $cm^{-3}$) and a stripe-shaped multi-layered structure formed on the n-type InP substrate 1. The n-type InP substrate I has a stripe-shaped ridge, and a diffraction grating 2 having a period of 201.5 nm for distributed-feedback is formed on the n-type InP substrate 1.

The stripe-shaped multi-layered structure includes a multi quantum well active layer 4, and a pair of InGaAsP optical wave guide layers 3 and 5 provided so as to be adjacent to the multi quantum well active layer 4. More specifically, in the stripe-shaped multi-layered structure, the n-type InGaAsP optical wave guide layer 3 ($n=7\times10^{17}$ $cm^{-3}$) having a bandgap wavelength $\lambda$ g of 1.05 μm and a thickness of 150 nm, the undoped InGaAsP/InGaAsP multi quantum well active layer 4, the p-type InGaAsP optical wave guide layer 5 ($p=7\times10^{17}$ $cm^{-3}$) having a bandgap wavelength $\lambda$ g of 1.05 μm and a thickness of 30 nm, and a p-type InP cladding layer 6 ($p=1\times10^{18}$ $cm^{-3}$) are provided in this order.

The stripe-shaped multi-layered structure is obtained by growing crystals on the n-type InP substrate 1 as each semiconductor layer and etching the semiconductor layers so as to give a stripe width of 1.2 μm. Both side faces of the stripe-shaped multi-layered structure are covered with n-type InP or p-type InP, whereby a wave guide structure having a refractive index is formed.

On the p-type InP cladding layer 6, a p-type electrode 8 is provided via a p-type InGaAsP contact layer 7 ($p=1\times10^{18}$ $cm^{-3}$) having a bandgap wavelength $\lambda$ g of 1.3 μm and a thickness of 100 nm by vapor deposition. Under the n-type InP substrate 1, an n-type electrode 9 is provided.

The multi quantum well active layer 4 includes InGaAsP well layers 10 each having a thickness of 6 nm and being applied with compressive strain of 0.7% and InGaAsP barrier layers 11 each having a bandgap wavelength of $\lambda$ g of 1.05 μm and a thickness of 10 nm. Herein, the number of well layers is 5 to 10.

The InGaAsP optical wave guide layers 3 and 5 and the InGaAsP barrier layers 11 are lattice-matched with the InP substrate 1. In addition, the compositions of the InGaAsP optical wave guide layers 3 and 5 and of the InGaAsP barrier layer are controlled so as to be substantially equal to 1.05 μm.

Figure 2:
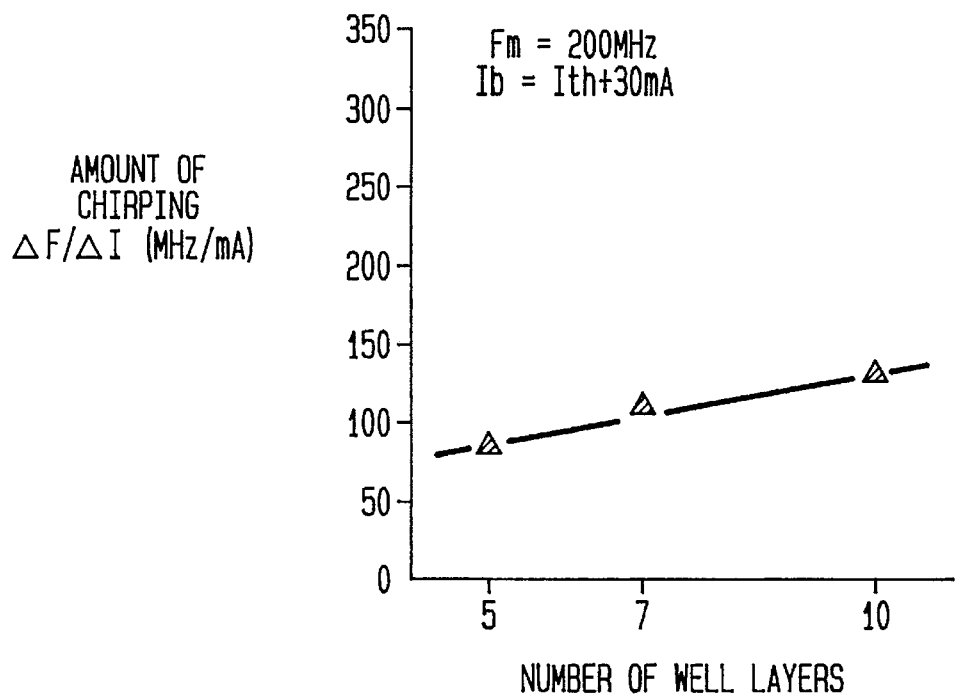
FIG. 2 is a graph showing the relation between the chirping amount and the number of well layers in the multi quantum well semiconductor laser according to the present invention.

FIG. 2 is a graph showing measured chirping amounts of semiconductor lasers with the structure of FIG. 1, respectively having 5, 7, and 10 well layers. In measurement, the modulation frequency fm is set to be 200 MHz and the bias current is set to be Ith (threshold current)+30 mA.

In the semiconductor laser having 10 well layers, the chirping amount was about 120 MHz/mA. In the semiconductor laser having 5 well layers, the amount of chirping was about 90 MHz/mA. Accordingly, as the number of well layers decreases, the amount of chirping decreases, as is understood from FIG. 2. These values are half or less of the conventional example, revealing that the amount of chirping is greatly decreased compared with the conventional example.

As described above, according to the present invention, the change in the amount of chirping with respect to the number of well layers can be determined by Expression 1. The electrons can be prevented from overflowing the well layers by using InGaAsP having a bandgap wavelength of $\lambda$ g=1.05 μm for the barrier layers. Thus, the effects of the present invention are shown.

Figure 3:
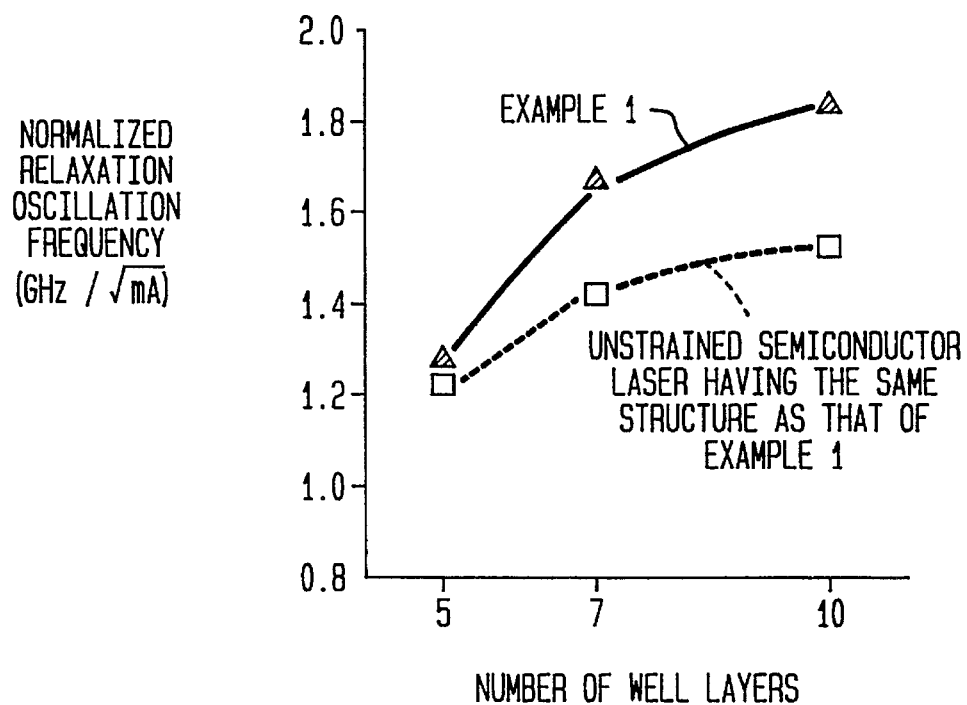
FIG. 3 is a graph showing the relation between the normalized relaxation oscillation frequency and the number of well layers in the multi quantum well semiconductor laser according to the present invention.

FIG. 3 is a graph showing measured relaxation oscillation frequencies in the above-mentioned semiconductor lasers, respectively having 5, 7, and 10 well layers. In this graph, the vertical axis represents a relaxation oscillation frequency normalized with an injection current amount of a threshold value or more (normalized relaxation oscillation frequency). The characteristic of a semiconductor laser having unstrained well layers is also shown in the graph, among the semiconductor lasers having substantially the same structure as that of the semiconductor laser of Example 1.

In the case of 5 well layers, no difference in characteristic was found between the semiconductor laser of Example 1 having strained well layers and the semiconductor laser having unstrained well layers. In the case of 7 and 10 well layers, the normalized relaxation oscillation frequency of the semiconductor laser having strained well layers is about 1.2 times that of the semiconductor laser having unstrained well layers. It is understood that the effect of the strained well layers is obtained. This value is about 1.2 times that of the conventional example, revealing that high relaxation oscillation frequency characteristics can be obtained from the semiconductor laser according to the present invention.

The threshold current is varied depending upon the number of well layers (i.e., in the range of 10 mA to 20 mA). In spite of the fact that both of the barrier layers and the optical wave guide layer are made of InGaAsP having a bandgap wavelength $\lambda$ g of 1.05 μm to decrease an optical confinement factor, these threshold values are similar to those of the conventional semiconductor laser having the same number of well layers. This is considered to be the effect of strain introduction into the well layers.

Figure 10:
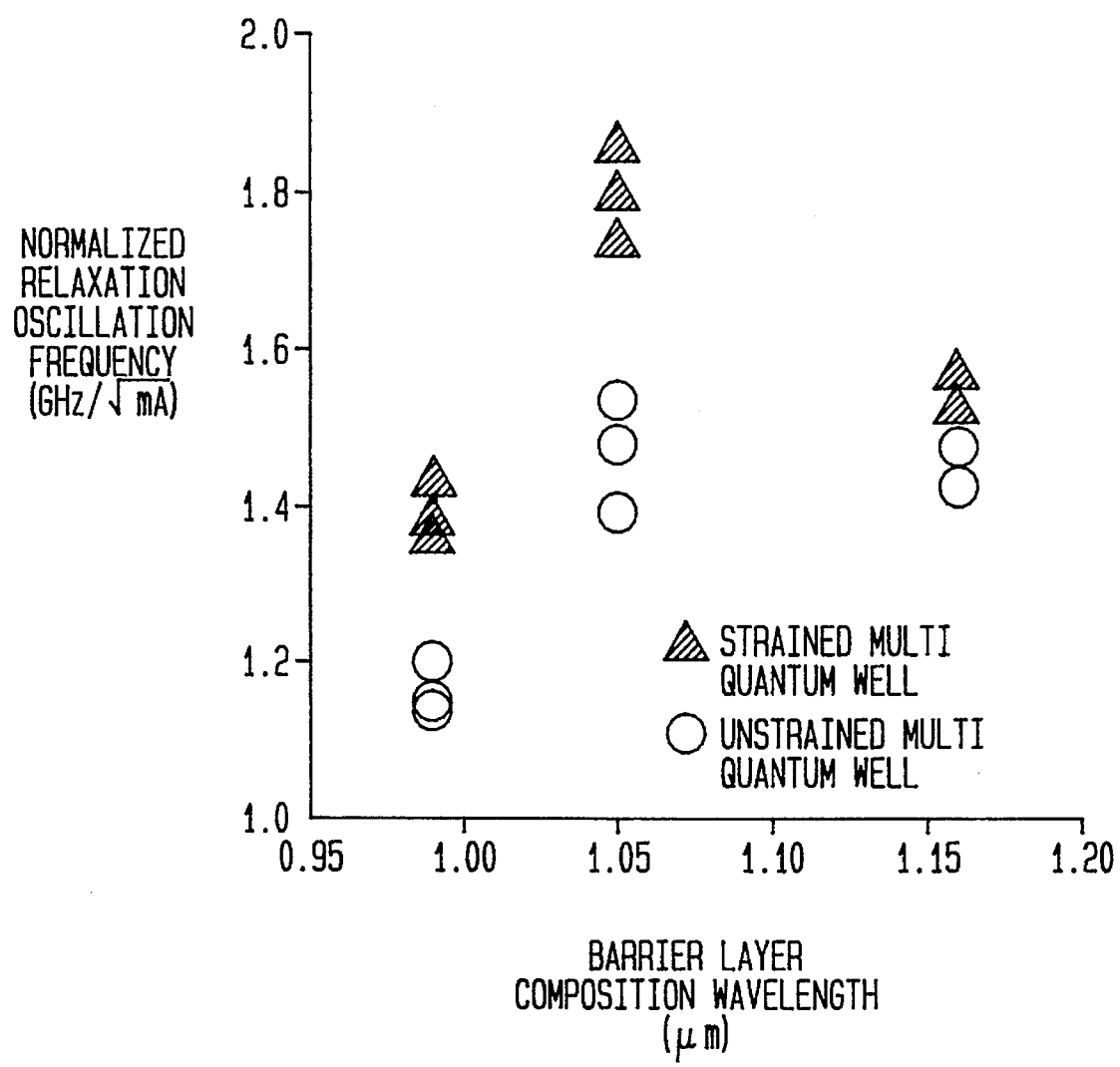
FIG. 10 is a graph showing the relation between the normalized relaxation oscillation frequency and the bandgap wavelength of barrier layers.

FIG. 10 is a graph showing the comparison of relaxation oscillation frequency characteristics between the unstrained multi quantum well DFB lasers having three kinds of barrier layer bandgap wavelengths and the strained multi quantum well DFB lasers having three kinds of barrier layer bandgap wavelengths. The horizontal axis represents a barrier layer bandgap wavelength and the vertical axis represents a normalized relaxation oscillation frequency. The number of well layers of the semiconductor lasers used for measurement is 10. In this graph, data regarding the semiconductor laser having a barrier layer bandgap wavelength of 1.05 μm is according to Example 1, and data regarding the semiconductor laser having a carrier layer bandgap wavelength of 1.15 μm is according to the conventional example. The data regarding the semiconductor laser having a barrier layer bandgap wavelength of 1.00 μm is according to the comparative example (the barrier layer bandgap wavelength is set to be shorter than that of Example 1).

As is understood from FIG. 10, in the case where the barrier layer bandgap wavelength is 1.15 μm, the increase in the normalized relaxation oscillation frequency due to the introduction of strain into the well layers is hardly caused. In the case where the barrier layer bandgap wavelength is 1.05 μm, as described above, the normalized relaxation oscillation frequency is increased by 1.2 times that of the unstrained semiconductor laser, due to the introduction of strain into the well layers. In the case where the barrier layer bandgap wavelength is 1.00 μm, it is observed that the normalized relaxation oscillation frequency is increased due to the introduction of strain into the well layers; however, the increase is remarkably smaller than Example 1. The reason for this is as follows.

The optical confinement factor in the active layer is decreased as the barrier layer bandgap wavelength becomes shorter. In addition, the bandgap difference of a valence band becomes too large, causing a non-uniform injection of holes into each well layer.

As is understood from FIG. 10, in the multi quantum well semiconductor laser lasing at 1.29 to 1.33 μm wavelength, the bandgap wavelength of the barrier layers is set to be substantially equal to 1.05 μm, whereby the normalized relaxation oscillation frequency can be remarkably increased.

Figure 5:
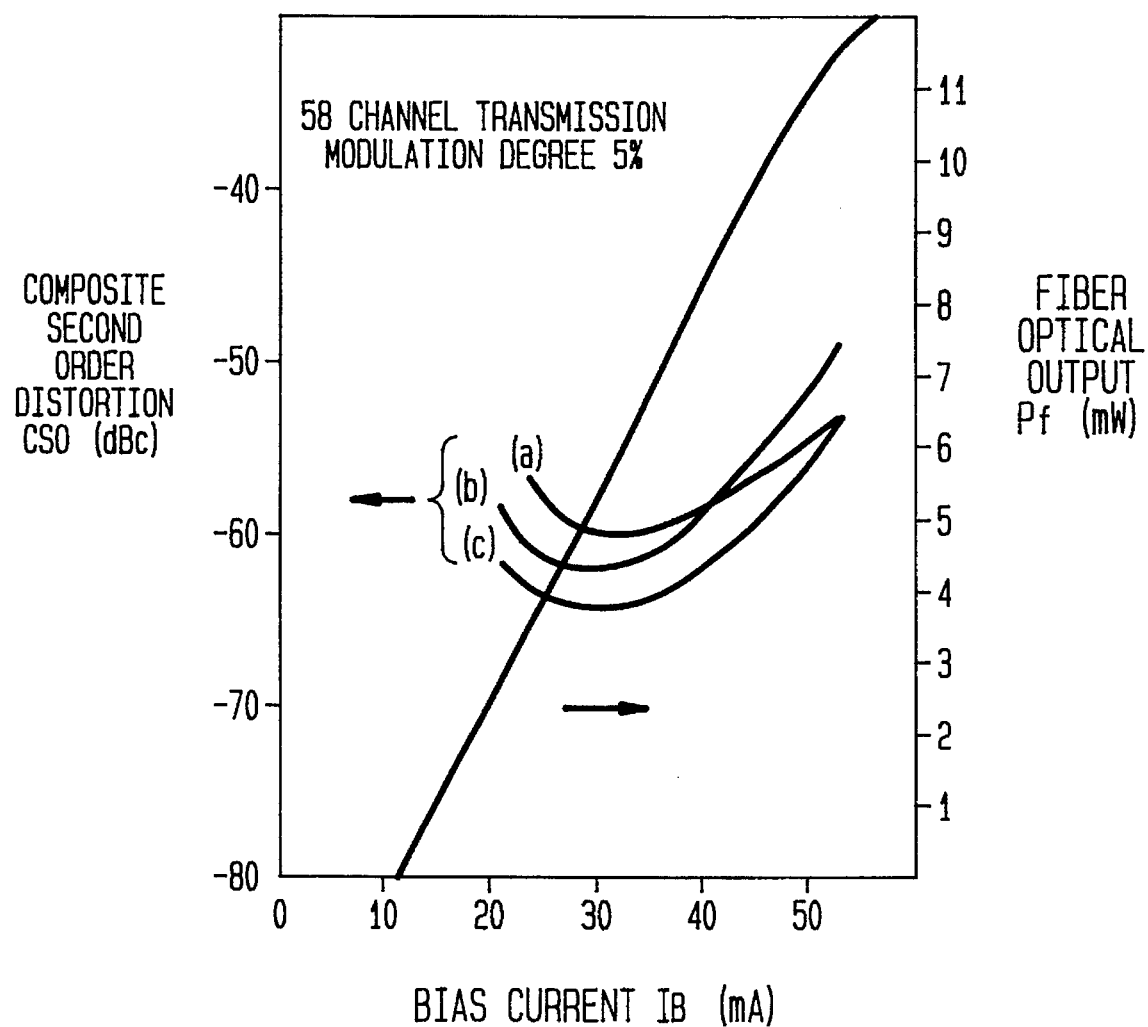
FIG. 5 shows an electric current-optical output characteristic and an electric current-composite second order distortion characteristic of a module in which the multi quantum well semiconductor laser according to the present invention is incorporated.
Figure 6:
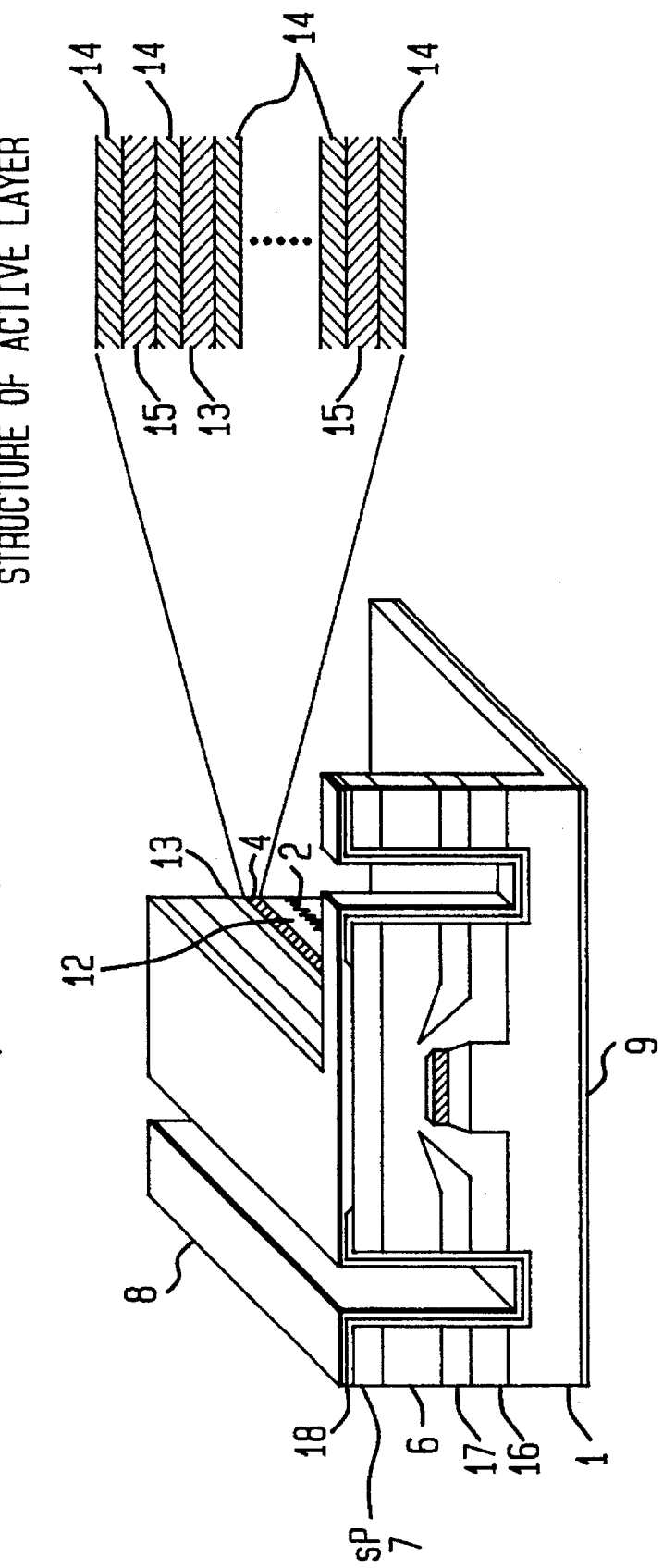
FIG. 6 is a diagram illustrating the structure of a conventional MQW-DFB laser.
Figure 7:
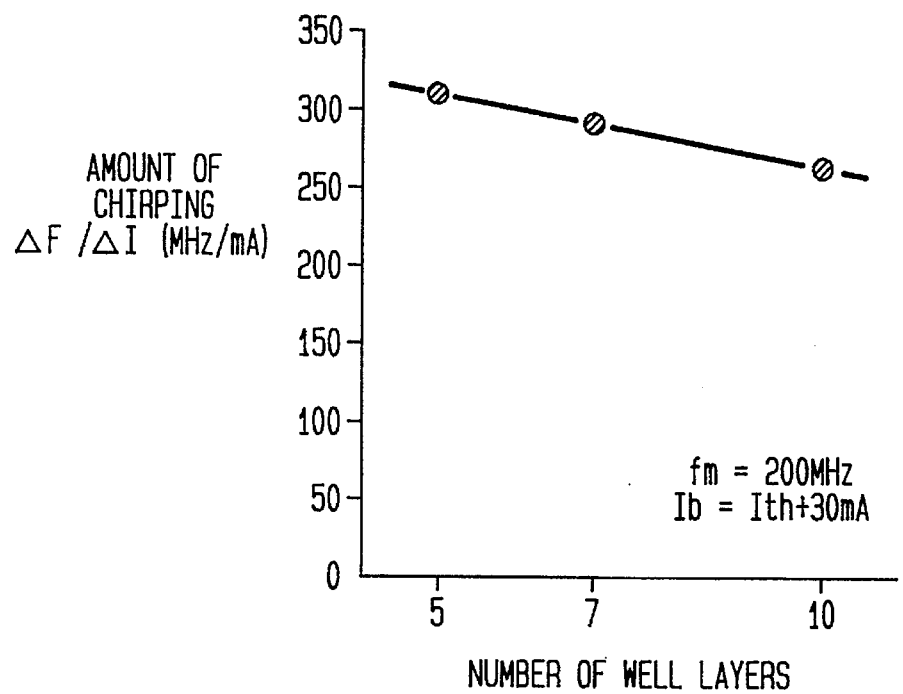
FIG. 7 is a graph showing the relation between the chirping amount and the number of well layers in the conventional MQW-DFB laser.
Figure 8:
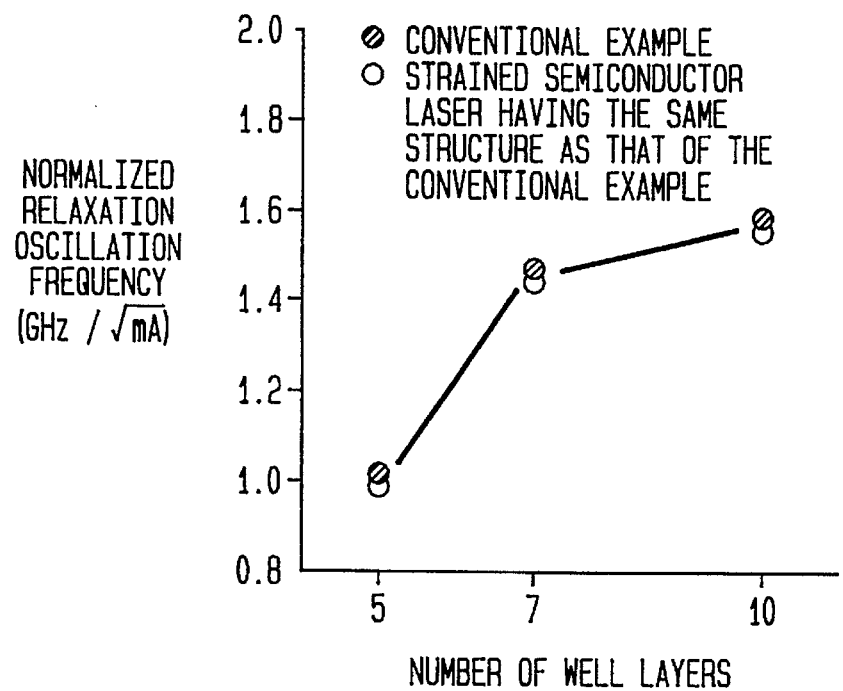
FIG. 8 is a graph showing the relation between the normalized relaxation oscillation frequency and the number of well layers in the conventional MQW-DFB laser.
Figure 9:
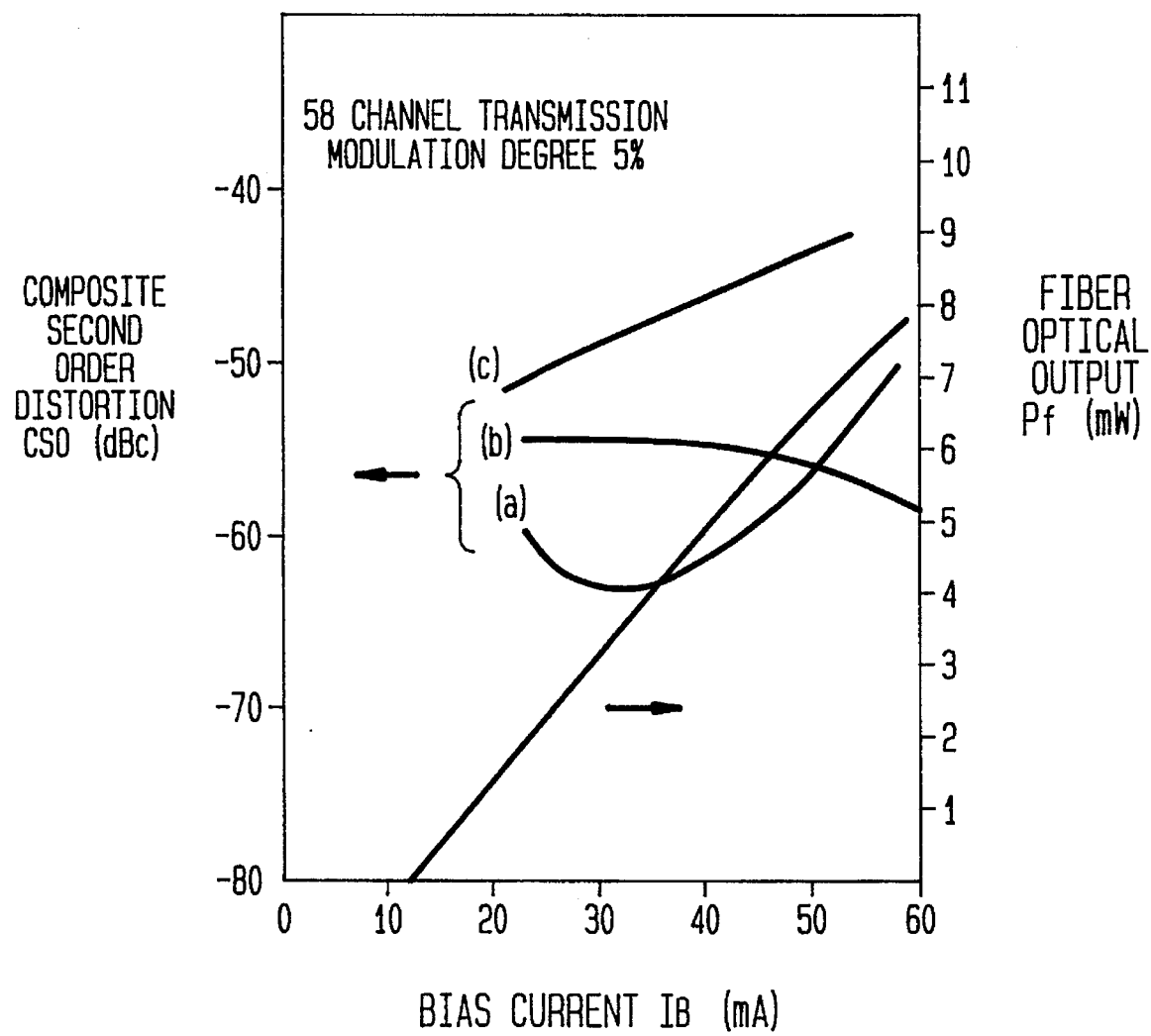
FIG. 9 is an electric current-optical output characteristic and an electric current-composite second order distortion characteristic of a module in which the conventional MQW-DFB laser is incorporated.

Among the semiconductor lasers of Example 1, the semiconductor laser having 10 well layers is incorporated in a module provided with an isolator, and the composite second order distortion (CSO) and the bias current dependence of the optical fiber output (Pf) from the module are measured when a TV signal of 58 channels of NTSC are transmitted through the optical fibers (10 km). FIG. 5 shows the measurement results. Herein, CSO is detected at 55 MHz where the composite number of distortion becomes maximum. In the graph of FIG. 5, curves (b) and (c) show characteristics of the satisfactory semiconductor lasers. In the wide range of optical fiber output of 2.5 to 6 mW, a low distortion characteristic (i.e., CSO<−60 dBc) is obtained. In addition, 53 dB or more of noise (CNR) and −65 dBc or less of a composite third order distortion (CTB), which are required for a high image CATV, can be obtained.

The semiconductor lasers showing characteristics represented by the curves (b) and (c) are 50% or more among the semiconductor lasers lasing in a single mode. Thus, semiconductor lasers having a low distortion characteristic can be obtained with a higher yield compared with the conventional example. The same results are also obtained in the semiconductor laser having 7 well layers. Low distortion characteristics are obtained with high yield in Example 1 for the following reasons.

The barrier layers and the optical wave guide layer are made of InGaAsP having a bandgap wavelength of $\lambda g$ of 1.05 μm, thereby suppressing the axis-direction hole burning effect. In addition, the standardization coupling coefficient can be controlled in an optimum range with very small variation.

A fiber optical output is 8 mW at a bias current of 40 mA. This output is 1.6 times that of the conventional example (i.e., 5 mW). The reason for this is as follows:

The barrier layers and the optical wave guide layer are made of InGaAsP having a bandgap wavelength $\lambda g$ of 1.05 μm, whereby an optical confinement factor is decreased and an light emitting angle from the semiconductor laser becomes about half of the conventional example. Because of this, the amount of light coupled with the fiber is greatly increased. As a result of the suppression of overflow of electrons from the well layers, the internal quantum efficiency is increased.

As described above, according to the semiconductor laser of the present invention, a bias current for obtaining a fiber optical output of 4 mW can be decreased from 35 mA to about 25 mA. In general, when the bias current is increased, a leak current component flowing through layers other than the active layer is increased, whereby the electric current-optical output characteristic becomes nonlinear and a distortion component is increased. According to the present invention, since the bias current can be decreased, low distribution can be realized at the same fiber optical output.

In Example 1, the optical wave guide layer and the barrier layers are made of InGaAsP having a bandgap wavelength $\lambda g$ of 1.05 μm. The same effects of the present invention can also be obtained when the bandgap wavelength $\lambda g$ is 1.05 μm±0.03 μm. When the bandgap wavelength is equal to or less than this range and close to InP, the optical confinement factor is extremely decreased and the threshold current is rapidly increased. When the bandgap wavelength is equal to or more than this range, electrons are likely to overflow the well layers, so that the characteristics remain unchanged compared with the conventional example.

Herein, the 1.3 μm wavelength DFB laser device is exemplified as a multi quantum well semiconductor laser. The present invention is not limited to a distributed-feedback type and can apply to Fabry-Perot laser devices.

The relation between the oscillation wavelength and the bandgap wavelength of the barrier layers is critical for obtaining the effects of the present invention. In the multi quantum well semiconductor laser lasing at 1.54 to 1.57 μm wavelength, when the bandgap wavelength of the barrier layers is set to be substantially 1.15 μm, the same effects as those of Example 1 can be obtained. The reason for this is as follows. The bandgap energy difference between the well layers and the barrier layers becomes nearly equal to that of Example 1 by setting the bandgap wavelength of the barrier layers at 1.15 μm.

In Example 1, although the barrier layers and the optical wave guide layer are made of InGaAsP having the same bandgap wavelength. In the case where the bandgap wavelength of the optical wave guide layer is shorter than that of the barrier layers, the barrier layers and the optical wave guide layer may be made of InGaAsP having different bandgap wavelengths.

In Example 1, a buried structure is shown; other structures such as a ridge structure can be used.

EXAMPLE 2

Figure 11:
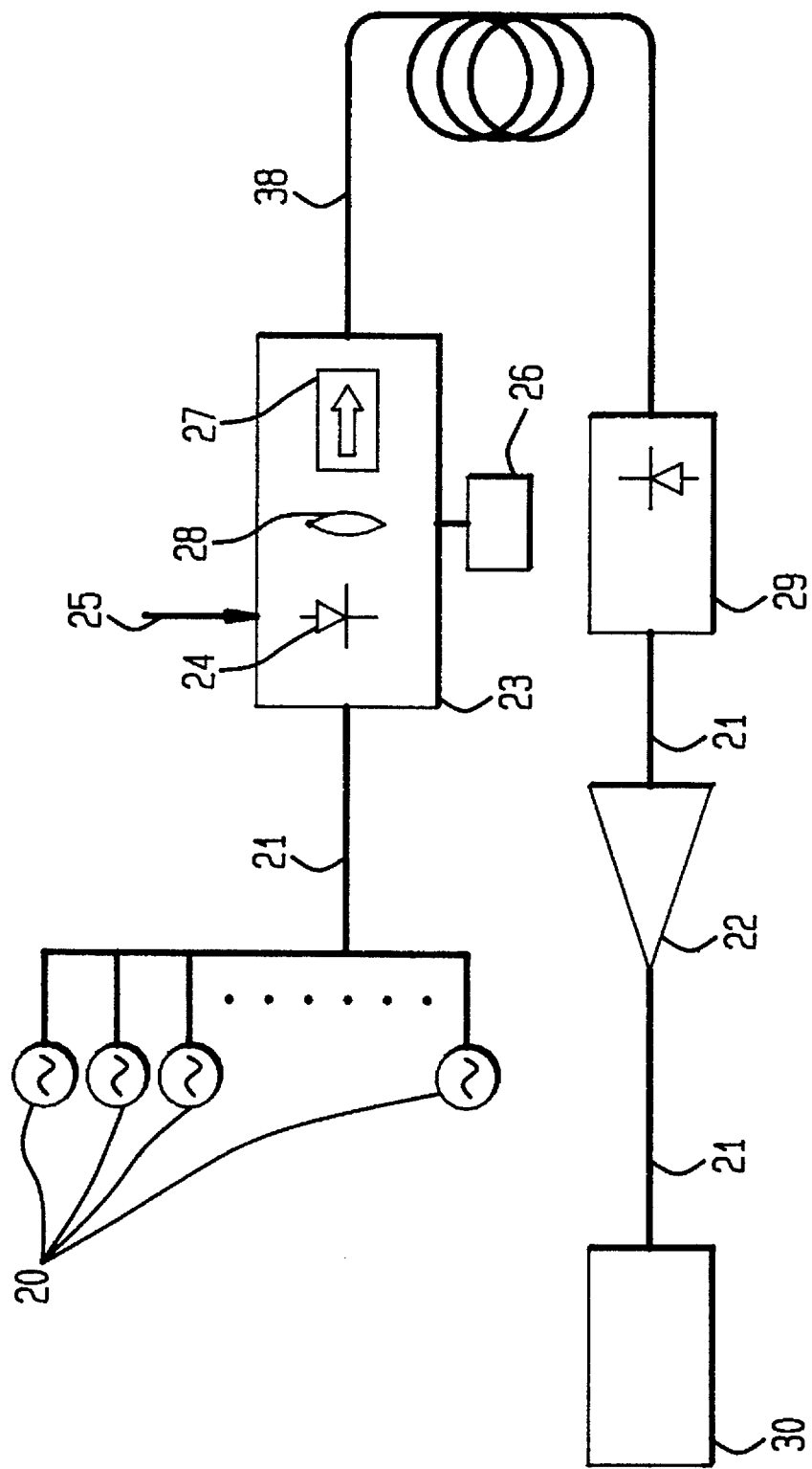
FIG. 11 shows an AM-FDM light transmission system according to the present invention.

FIG. 11 shows an AM-FDM light transmission system using the DFB laser having 10 well layers according to Example 1 as a light source for information transmission. The AM-FDM light transmission system is one of the optical communication systems widely used for a CATV.

In this system, an AM-FDM signal (carrier wave whose intensity is modulated with 100 different frequencies) is transmitted from an AM-FDM signal generator 20 to a DFB laser 24 through a high-frequency cable 21. The AM-FDM signal is modulated by the DFB laser 24 through which a D.C. current is flowing. The modulated light emitted from the DFB laser 24 is coupled with an optical fiber 38 through a lens 28 and an optical isolator 27 and the modulated light emitted from a light emitting facet positioned 10 km away from the DFB laser 24 is irradiated to a photodiode 29 to be converted into an electric signal. The electric signal thus obtained is transmitted to a signal analyzer 30 through a high-frequency amplifier 22. Herein, the DFB laser 24 is controlled by an automatic temperature and optical output control unit 26 so as to have a predetermined temperature and optical output. In addition, the DFB laser 24, the lens 28, and the optical isolator 27 are built in a laser module 23.

Figure 12:
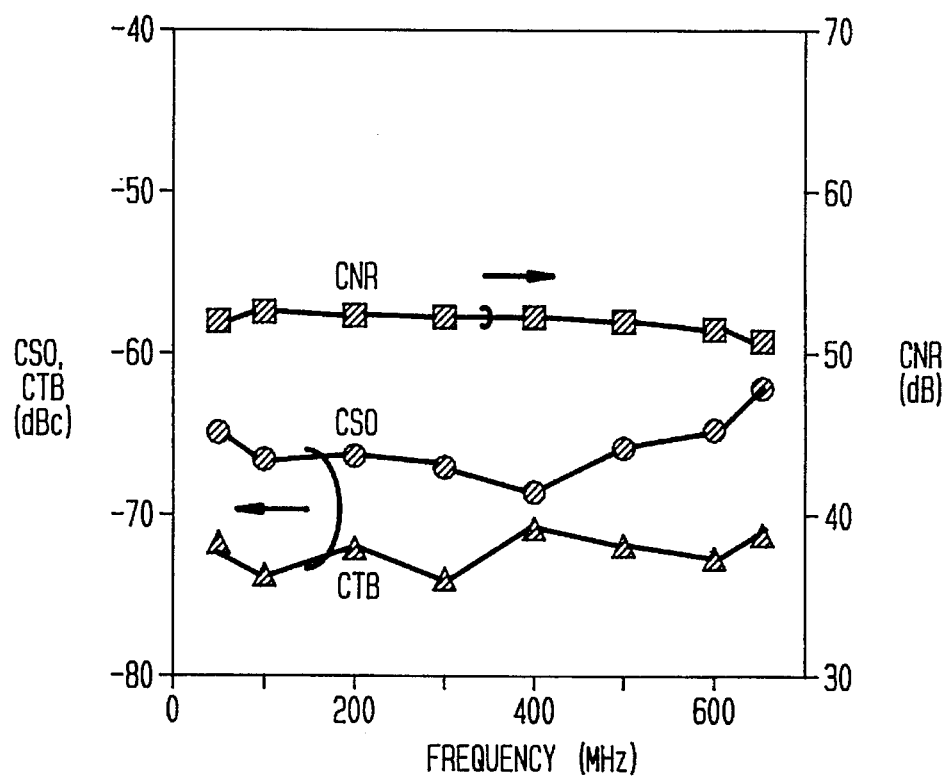
FIG. 12 shows noise and transmission distortion characteristics of the AM-FDM light transmission system according to the present invention.

FIG. 12 shows noise (CNR) and transmission distortion (CSO, CTB) characteristics of the AM-FDM light transmission system of Example 2. The horizontal axis represents a frequency at which CNR, CSO, and CTB are measured. 55 MHz corresponds to a frequency of the 1st signal, and 655 MHz corresponds to a frequency of the 100th signal. The frequency arrangement of signals is determined in accordance with the NTSC system. The degree of modulation of each signal is respectively 2%, and a D.C. current of 28 mA (Ith+17 mA) flows through the DFB laser 24.

In the frequencies of the 1st to 100th signals, a low distortion characteristic (i.e., CSO<−62 dBc) is obtained. In addition, 51 dB or more of noise (CNR) and −70 dBc or less of a composite third order distortion (CTB), which satisfy the qualities required for a high quality CATV, are obtained.

Figure 13:
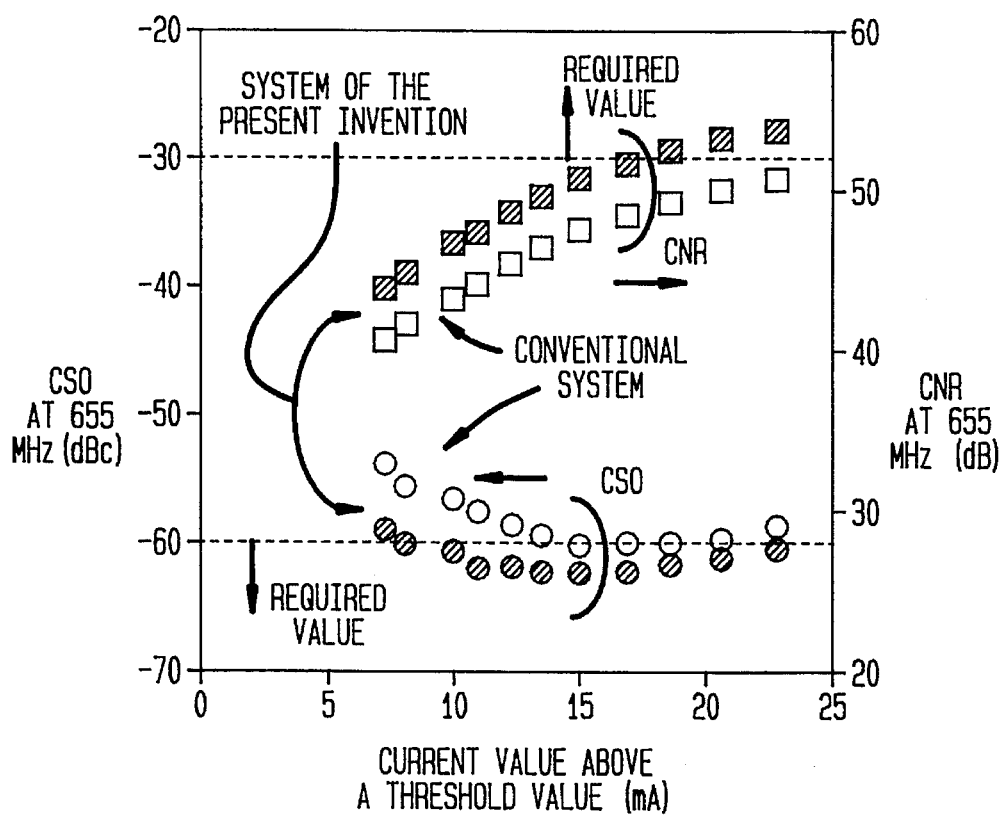
FIG. 13 is a graph showing the comparison of noise and transmission distortion characteristics between the AM-FDM light transmission system according to the present invention and the conventional AM-FDM light transmission system.

FIG. 13 shows the comparison of noise (CNR) and transmission distortion (CSO) characteristics between the AM-FDM light transmission system according to Example 2 and the AM-FDM light transmission system using the conventional DFB laser. The horizontal axis of a graph of FIG. 13 represents an injection current amount above a threshold value. According to Example 2, at an injection current amount of 17 mA of a threshold value or more, the qualities: CNR≧51 dB, CSO≦−60 dBc required for a high quality CATV are satisfied. In contrast, according to the conventional system, when the injection current amount is increased so as to satisfy CNR≧51 dB, CSO is increased to −60 dBc or more; thus, the qualities required for a high quality CATV cannot be obtained.

As described above, 100 channel AM-FDM. transmission, which has been impossible in the conventional system, can be realized according to the system of Example 2. This is because the system of Example 2 uses the DFB laser of Example 1 having a high relaxation oscillation frequency at a low electric current, so that the driving current can be reduced to half of the conventional example and the addition distortion and noise generated in the high-frequency amplifier and optical fiber can be prevented.

In Example 2, the AM-FDM light transmission system which is one of the optical communication systems is exemplified. If Example 2 is applied to other analog FM-FDM light transmutation systems and a QAM light transmission system, a transmission signal will also have a large capacity in the same way as described above. In addition, even in digital light transmission systems, the same effects can be obtained.

In the multi quantum well semiconductor layer according to the present invention, a chirping amount is decreased to a half of that of the conventional multi quantum well semiconductor laser and a relaxation oscillation frequency is increased by 1.2 times of that of the conventional multi quantum well semiconductor laser. Because of this, according to the present invention, a semiconductor laser having a broad bandwidth low distribution characteristic and no transmission deterioration can be provided with high yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A multi quantum well semiconductor laser comprising an InP substrate and a multi-layered structure formed on the InP substrate, lasing at 1.29 μm to 1.33 μm wavelength, wherein the multi-layered structure includes at least a multi quantum well active layer, the multi quantum well active layer including InGaAsP well layers and InGaAsP barrier layers alternately provided, the InGaAsP well layers have a compressive strain and the InGaAsP barrier layers are lattice matched with the InP substrate, and a bandgap wavelength of the InGaAsP barrier layers is substantially equal to 1.05 μm, and wherein the multi-layered structure further includes at least one InGaAsP optical wave guide layer provided so as to be adjacent to the multi quantum well active layer, the InGaAsP optical wave guide layer is lattice matched with the InP substrate, and a bandgap wavelength of the InGaAsP optical wave guide layer is substantially equal to 1.05 μm.

2. A multi quantum well semiconductor laser according to claim 1, wherein the multi-layered structure is formed in a stripe shape extending along a cavity length.

3. A multi quantum well semiconductor laser according to claim 1, wherein the InP substrate has a diffraction grating for distributed feedback on at least part of its surface.

4. An optical communication system using a semiconductor laser according to claim 1 as a light source for light transmission.

5. A multi quantum well semiconductor laser according to claim 1, wherein the compressive strain of the InGaAsP well layers is in the range of 0.5% to 1.5%.

* * * * *

UNITED STATES PATENT AND TRADE MARK OFFICE
CERTIFICATE OF CORRECTION

PATENT NO. : 5,621,747
DATED : April 15, 1997
INVENTOR(S) : Kitoh et al.

It is certified that error appears in the above-identified patent and that said Letters Patent is hereby corrected as shown below:

On the cover, page 2, item [56] References Cited, Other Publications, the cited reference by "S. Hausser et al." delete "pp. 663-663" and insert --pp. 663-665--.

On the cover, page 2, item [56] References Cited, Other Publications, the cited reference, "MQW Distributed-feedback...Low Chirping" should be --Y. Matsui, et al., "High-speed Operation of Strained-layer InGaAsP MQW Distributed-feedback Lasers with Low Chirping", *Optical Fiber Communication Conference, San Jose, Technical Digest Series,* vol. 5, p. 271 (February 1992).

Signed and Sealed this

Twenty-fourth Day of February, 1998

Attest:

BRUCE LEHMAN

*Attesting Officer*  Commissioner of Patents and Trademarks